(12) United States Patent
Yamada et al.

(10) Patent No.: US 9,583,346 B2
(45) Date of Patent: Feb. 28, 2017

(54) METHOD FOR MANUFACTURING SILICON CARBIDE SEMICONDUCTOR DEVICE

(71) Applicant: Sumitomo Electric Industries, Ltd., Osaka-shi (JP)

(72) Inventors: Shunsuke Yamada, Osaka (JP); Takeyoshi Masuda, Osaka (JP); Taku Horii, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/035,183

(22) PCT Filed: Sep. 24, 2014

(86) PCT No.: PCT/JP2014/075213
§ 371 (c)(1),
(2) Date: May 6, 2016

(87) PCT Pub. No.: WO2015/068481
PCT Pub. Date: May 14, 2015

(65) Prior Publication Data
US 2016/0293423 A1     Oct. 6, 2016

(30) Foreign Application Priority Data

Nov. 8, 2013   (JP) ................................. 2013-232198

(51) Int. Cl.
*H01L 21/04* (2006.01)
*H01L 21/324* (2006.01)
(Continued)

(52) U.S. Cl.
CPC ......... *H01L 21/0475* (2013.01); *H01L 21/046* (2013.01); *H01L 21/324* (2013.01);
(Continued)

(58) Field of Classification Search
CPC .............................. H01L 21/265; H01L 21/20
See application file for complete search history.

(56) References Cited

U.S. PATENT DOCUMENTS

| | | | | |
|---|---|---|---|---|
| 6,090,749 | A * | 7/2000 | Kowalski | B41J 2/14016 347/105 |
| 7,510,986 | B2 * | 3/2009 | Miura | H01L 21/0445 257/E21.054 |

(Continued)

FOREIGN PATENT DOCUMENTS

| | | |
|---|---|---|
| JP | H04-034732 U | 3/1992 |
| JP | 2005-197464 A | 7/2005 |

(Continued)

OTHER PUBLICATIONS

S. J. Pearton et al., "Rapid thermal annealing of GaAs in a graphite susceptor—comparison with proximity annealing," J. Appl. Phys. 66 (2), Jul. 15, 1989, p. 663-665.

(Continued)

*Primary Examiner* — Scott B Geyer
*Assistant Examiner* — S.M. S Imtiaz
(74) *Attorney, Agent, or Firm* — IPUSA, PLLC

(57) ABSTRACT

A method for manufacturing a silicon carbide semiconductor device includes steps below. A silicon carbide substrate having a first main surface and a second main surface opposite to the first main surface, the first main surface having a maximal diameter greater than 100 mm, is prepared. An impurity region is formed on a side of the first main surface of the silicon carbide substrate. In a plan view, a cover member is arranged on the side of the first main surface so as to cover at least the entire impurity region. The silicon carbide substrate is annealed at a temperature lower (Continued)

than a melting point of the cover member while the cover member is arranged on the side of the first main surface of the silicon carbide substrate.

10 Claims, 9 Drawing Sheets

(51) Int. Cl.
| | |
|---|---|
| H01L 29/16 | (2006.01) |
| H01L 29/78 | (2006.01) |
| H01L 29/739 | (2006.01) |
| H01L 29/66 | (2006.01) |
| H01L 29/872 | (2006.01) |
| H01L 21/02 | (2006.01) |

(52) U.S. Cl.
CPC .... *H01L 29/1608* (2013.01); *H01L 29/66068* (2013.01); *H01L 29/7395* (2013.01); *H01L 29/7802* (2013.01); H01L 21/0262 (2013.01); H01L 21/02378 (2013.01); H01L 21/02529 (2013.01); H01L 29/872 (2013.01)

(56) References Cited

U.S. PATENT DOCUMENTS

| | | |
|---|---|---|
| 2007/0167026 A1 | 7/2007 | Miura |
| 2009/0042375 A1 | 2/2009 | Sawada et al. |
| 2011/0000434 A1 | 1/2011 | Sawada et al. |
| 2011/0165764 A1 | 7/2011 | Sasaki et al. |
| 2012/0056201 A1 | 3/2012 | Wada et al. |
| 2012/0056202 A1 | 3/2012 | Wada et al. |
| 2012/0056203 A1* | 3/2012 | Fujikawa ............ H01L 29/1608 257/77 |
| 2012/0061686 A1 | 3/2012 | Nishiguchi et al. |
| 2012/0061687 A1 | 3/2012 | Harada et al. |
| 2012/0070605 A1 | 3/2012 | Sasaki et al. |
| 2013/0020586 A1* | 1/2013 | Miura ................ H01L 29/0615 257/77 |
| 2013/0092956 A1 | 4/2013 | Ishibashi et al. |
| 2015/0333175 A1* | 11/2015 | Kiyosawa ........... H01L 29/6606 257/77 |

FOREIGN PATENT DOCUMENTS

| | | |
|---|---|---|
| JP | 2007-335649 A | 12/2007 |
| JP | 2009-065112 A | 3/2009 |
| WO | WO-2010/131571 A1 | 11/2010 |
| WO | WO-2013/054580 A1 | 4/2013 |

OTHER PUBLICATIONS

International Search Report for PCT International Application No. PCT/JP2014/075213, dated Dec. 16, 2014.

* cited by examiner

METHOD FOR MANUFACTURING SILICON CARBIDE SEMICONDUCTOR DEVICE

TECHNICAL FIELD

This invention relates to a method for manufacturing a silicon carbide semiconductor device and particularly to a method for manufacturing a silicon carbide semiconductor device in which warpage can be lessened and adhesion of an impurity can be suppressed.

BACKGROUND ART

In order to allow a semiconductor device such as a metal oxide semiconductor field effect transistor (MOSFET) to be high in breakdown voltage and low in loss and to be used in a high-temperature environment, silicon carbide has recently increasingly been adopted as a material forming a semiconductor device. Silicon carbide is a wide band gap semiconductor greater in band gap than silicon which has conventionally widely been used as a material forming a semiconductor device. Therefore, by adopting silicon carbide as a material forming a semiconductor device, a higher breakdown voltage and a lower on-resistance of a semiconductor device can be achieved. A semiconductor device in which silicon carbide has been adopted as a material is also advantageous in that lowering in characteristics during use in a high-temperature environment is less than in a semiconductor device in which silicon has been adopted as a material.

For example, Japanese Utility Model Laying-Open No. 4-34732 (PTD 1) describes an apparatus for annealing a wafer. With the apparatus for manufacturing by annealing of a wafer, a GaAs wafer is annealed, with a ring-shaped cover over the GaAs wafer being provided to cover only an outer circumferential portion of the GaAs wafer having a diameter of 76 mm.

S. J. Pearton and R. Caruso, "Rapid thermal annealing of GaAs in a graphite susceptor-comparison with proximity annealing," J. Appl. Phys. 66 (2), 15 Jul. 1989, page 663-665 (NPD 1) describes a method of rapid thermal annealing, with a GaAs substrate being arranged in a susceptor made of graphite. According to the rapid thermal annealing method, a GaAs substrate is annealed, with a graphite cap being arranged above the GaAs substrate having a diameter of 2 inches (approximately 50 mm).

CITATION LIST

Patent Document

PTD 1: Japanese Utility Model Laying-Open No. 4-34732

Non Patent Document

NPD 1: S. J. Pearton and R. Caruso, "Rapid thermal annealing of GaAs in a graphite susceptor-comparison with proximity annealing," J. Appl. Phys. 66 (2), 15 Jul. 1989, page 663-665

SUMMARY OF INVENTION

Technical Problem

When warpage of a silicon carbide substrate is great, in arranging the silicon carbide substrate, for example, on a surface of a substrate holding portion, a region where the silicon carbide substrate is in contact with the surface of the substrate holding portion and a region where the silicon carbide substrate is not in contact with the surface of the substrate holding portion are created. Therefore, for example, in a step of activation annealing for activating an impurity or in a step of annealing a silicon carbide substrate such as alloying annealing in which an electrode is alloyed, a region of the silicon carbide substrate in contact with the substrate holding portion is more likely to be heated by heat conduction from the substrate holding portion than a region not in contact with the substrate holding portion, which results in failure in uniform heating of the silicon carbide substrate. This will be a cause for non-uniformity of electrical characteristics of a silicon carbide semiconductor device including the silicon carbide substrate. As described in the document, when a diameter is not greater than approximately 76 mm, warpage of a silicon carbide semiconductor substrate is not so great. When a diameter is greater than 100 mm, however, warpage of a silicon carbide semiconductor substrate is noticeably great.

Furthermore, adhesion of an impurity such as sodium or iron to a surface of a silicon carbide semiconductor substrate may cause degradation in characteristics such as lowering in threshold voltage or lowering in breakdown voltage of a silicon carbide semiconductor device.

The present invention was made to solve the problem as above, and an object thereof is to provide a method for manufacturing a silicon carbide semiconductor device in which warpage can be lessened and adhesion of an impurity can be suppressed.

Solution to Problem

A method for manufacturing a silicon carbide semiconductor device according to the present invention includes the steps below. A silicon carbide substrate having a first main surface and a second main surface opposite to the first main surface, the first main surface having a maximal diameter greater than 100 mm, is prepared. An impurity region is formed on a side of the first main surface of the silicon carbide substrate. In a plan view, a cover member is arranged on the side of the first main surface so as to cover at least the entire impurity region. The silicon carbide substrate is annealed at a temperature lower than a melting point of the cover member while the cover member is arranged on the side of the first main surface of the silicon carbide substrate.

Advantageous Effects of Invention

According to the present invention, a method for manufacturing a silicon carbide semiconductor device in which warpage can be lessened and adhesion of an impurity can be suppressed can be provided.

DESCRIPTION OF EMBODIMENTS

Figure 1:
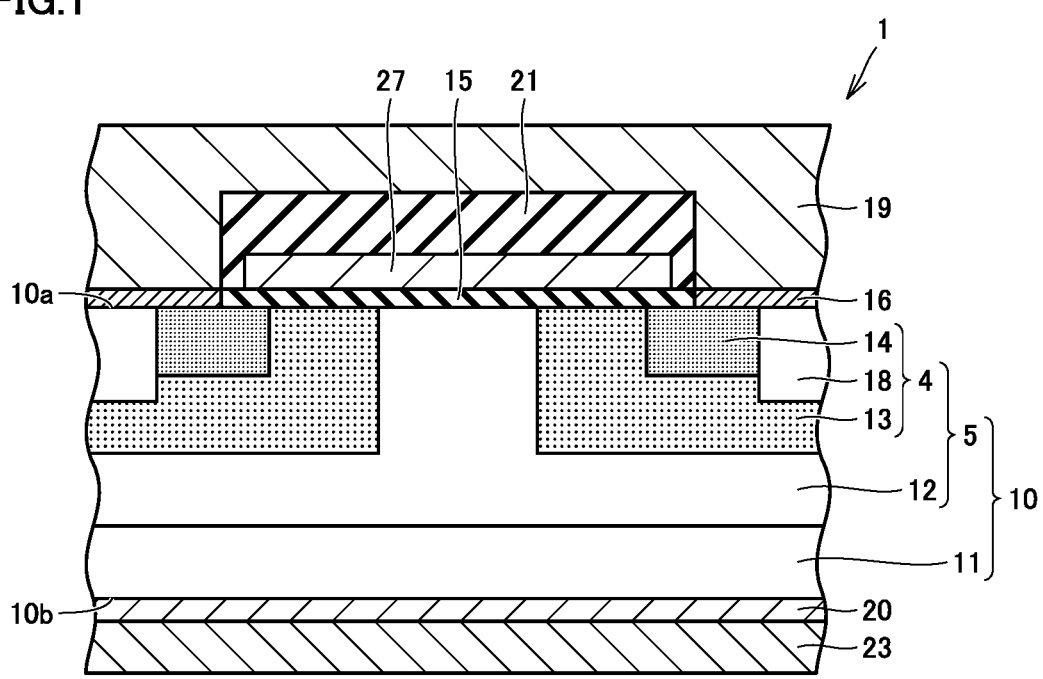
FIG. 1 is a schematic cross-sectional view for schematically illustrating a structure of a silicon carbide semiconductor device according to one embodiment of the present invention.

Description of Embodiment of Invention of Present Application

An embodiment of the present invention will be described hereinafter with reference to the drawings. In the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ), and { }, respectively. Moreover, a crystallographically negative index is expressed by a number with a bar "-" thereabove, however, a negative sign herein precedes a number. In expressing an angle, a system in which a total azimuth angle is defined as 360 degrees is employed.

(1) A method for manufacturing a silicon carbide semiconductor device 1 according to the embodiment includes steps below. A silicon carbide substrate 10 having a first main surface 10a and a second main surface 10b opposite to first main surface 10a, first main surface 10a having a maximal diameter greater than 100 mm, is prepared. An impurity region 4 is formed on a side of first main surface 10a of silicon carbide substrate 10. A cover member 2 is arranged on the side of first main surface 10a so as to cover at least the entire impurity region 4 in a plan view. Silicon carbide substrate 10 is annealed at a temperature lower than a melting point of cover member 2 while cover member 2 is arranged on the side of first main surface 10a of silicon carbide substrate 10.

According to the method for manufacturing silicon carbide semiconductor device 1 according to the above, cover member 2 is arranged on the side of first main surface 10a of silicon carbide substrate 10 so as to cover at least the entire impurity region 4 in a plan view, and silicon carbide substrate 10 is annealed at a temperature lower than a melting point of cover member 2 while cover member 2 is arranged on the side of first main surface 10a of silicon carbide substrate 10. Since cover member 2 is arranged on the side of first main surface 10a of silicon carbide substrate 10, warpage of silicon carbide substrate 10 can be lessened by a weight of cover member 2. Since silicon carbide substrate 10 is annealed while cover member 2 is arranged on the side of first main surface 10a of silicon carbide substrate 10 so as to cover the entire impurity region 4, adhesion of such a metal impurity as sodium in the vicinity of impurity region 4 can be suppressed.

(2) In the method for manufacturing silicon carbide semiconductor device 1 according to (1), preferably, in the step of arranging cover member 2, cover member 2 satisfying a condition that an absolute value of a difference between a first amount of warpage and a second amount of warpage is not greater than 100 μm is arranged, with an amount of warpage of silicon carbide substrate 10 at a room temperature being defined as the first amount of warpage and an amount of warpage of cover member 2 at a room temperature being defined as the second amount of warpage. Thus, a gap between first main surface 10a of silicon carbide substrate 10 and cover member 2 can effectively be made smaller. Consequently, adhesion of such a metal impurity as sodium in the vicinity of impurity region 4 can be suppressed.

(3) In the method for manufacturing silicon carbide semiconductor device 1 according to (1) or (2), preferably, the first main surface has a maximal diameter not smaller than 150 mm. Thus, warpage of silicon carbide substrate 10 can effectively be lessened even in such a situation that a diameter of silicon carbide substrate 10 is greater and silicon carbide substrate 10 tends to warp.

(4) In the method for manufacturing silicon carbide semiconductor device 1 according to any of (1) to (3), preferably, silicon carbide substrate 10 has a thickness not greater than 700 μm. Thus, warpage of silicon carbide substrate 10 can effectively be lessened even in such a situation that a thickness of silicon carbide substrate 10 is smaller and silicon carbide substrate 10 tends to warp.

(5) In the method for manufacturing silicon carbide semiconductor device 1 according to any of (1) to (4), preferably, a width of cover member 2 along first main surface 10a of silicon carbide substrate 10 is greater than a width of first main surface 10a. Thus, warpage of silicon carbide substrate 10 can effectively be lessened and adhesion of a metal impurity to first main surface 10a of silicon carbide substrate 10 can effectively be suppressed.

(6) In the method for manufacturing silicon carbide semiconductor device 1 according to any of (1) to (5), preferably, the step of arranging cover member 2 includes the step of arranging cover member 2 as being in contact with first main surface 10a of silicon carbide substrate 10. The step of annealing silicon carbide substrate 10 includes the step of activating an impurity in impurity region 4. Since cover member 2 is thus arranged as being in contact with first main surface 10a of silicon carbide substrate 10, adhesion of such a metal impurity as sodium to first main surface 10a of silicon carbide substrate 10 can be suppressed.

(7) In the method for manufacturing silicon carbide semiconductor device 1 according to (6), preferably, cover member 2 is made of a material containing at least any of carbon and silicon carbide. Thus, adhesion of such a metal impurity as sodium to first main surface 10a of silicon carbide substrate 10 can effectively be suppressed also in a temperature range of annealing for activating an impurity in impurity region 4.

(8) In the method for manufacturing silicon carbide semiconductor device 1 according to any of (1) to (5), preferably, a gate electrode 27 provided to face impurity region 4 of silicon carbide substrate 10 is formed after impurity region 4 is formed. An interlayer insulating film 21 covering gate electrode 27 is formed. A source electrode 16 in contact with first main surface 10a of silicon carbide substrate 10 is formed. The step of arranging cover member 2 includes the step of arranging cover member 2 so as to be in contact with interlayer insulating film 21 and distant from source electrode 16. Since cover member 2 is thus distant from source electrode 16, reaction between cover member 2 and source electrode 16 resulting in variation in contact resistance between source electrode 16 and silicon carbide substrate 10 can be suppressed.

(9) In the method for manufacturing silicon carbide semiconductor device 1 according to (8), preferably, the cover member is made of a material containing at least any of carbon, silicon, quartz, and silicon carbide. Thus, adhesion of such a metal impurity as sodium to first main surface 10a of silicon carbide substrate 10 can effectively be suppressed also in a temperature range of alloying source electrode 16.

(10) The method for manufacturing silicon carbide semiconductor device 1 according to any of (1) to (9) preferably further includes the step of pressing cover member 2 against silicon carbide substrate 10 after the step of arranging cover member 2. Thus, since a gap between cover member 2 and silicon carbide substrate 10 is made smaller, adhesion of such a metal impurity as sodium to first main surface 10a of silicon carbide substrate 10 can effectively be suppressed. In addition, since silicon carbide substrate 10 is heated by heat conduction through a mechanism pressing cover member 2 against silicon carbide substrate 10, a temperature in silicon carbide substrate 10 is made uniform. Consequently, warpage of silicon carbide substrate 10 can effectively be lessened.

(11) The method for manufacturing silicon carbide semiconductor device 1 according to (10) preferably further includes the step of holding silicon carbide substrate 10 on a substrate holding portion 3 such that second main surface 10b of silicon carbide substrate 10 faces a surface 3a of substrate holding portion 3 after the step of forming impurity region 4. In the step of pressing cover member 2 against silicon carbide substrate 10, cover member 2 is pressed against silicon carbide substrate 10 such that a gap between an outer circumferential portion 10c of second main surface 10b of silicon carbide substrate 10 and surface 3a of substrate holding portion 3 is made smaller. Since a gap between outer circumferential portion 10c of second main surface 10b of silicon carbide substrate 10 and surface 3a of substrate holding portion 3 is thus made smaller, heat from substrate holding portion 3 can effectively conduct to silicon carbide substrate 10. Consequently, a temperature in silicon carbide substrate 10 is made uniform and warpage of silicon carbide substrate 10 can effectively be lessened.

Details of Embodiment of Invention of Present Application

A construction of a MOSFET 1 representing a silicon carbide semiconductor device according to one embodiment of the present invention will initially be described. Referring to FIG. 1, MOSFET 1 according to the present embodiment mainly has silicon carbide substrate 10, gate electrode 27, a gate insulating film 15, interlayer insulating film 21, source electrode 16, a surface protecting electrode 19, a drain electrode 20, and a backside protecting electrode 23. Silicon carbide substrate 10 has first main surface 10a and second main surface 10b opposite to first main surface 10a and mainly includes a silicon carbide single-crystal substrate 11 and a silicon carbide epitaxial layer 5 provided on silicon carbide single-crystal substrate 11.

Silicon carbide single-crystal substrate 11 is composed of single crystals of hexagonal silicon carbide having, for example, a polytype of 4H. First main surface 10a of silicon carbide substrate 10 has a maximal diameter greater than 100 mm, preferably not smaller than 150 mm, and more preferably not smaller than 200 mm. First main surface 10a of silicon carbide substrate 10 is, for example, a {0001} plane or a surface angled off by not greater than 8° from the {0001} plane. Specifically, first main surface 10a is, for example, a (0001) plane or a surface angled off by approximately not greater than 8° from the (0001) plane, and second main surface 10b is a (000-1) plane or a surface angled off by approximately not greater than 8° from the (000-1) plane. Silicon carbide substrate 10 has a thickness, for example, not greater than 700 μm and preferably not greater than 600 μm. Silicon carbide substrate 10 has a thickness preferably not smaller than 250 μm and smaller than 600 μm, more preferably not smaller than 300 μm and smaller than 600 μm, further preferably not smaller than 250 μm and not greater than 500 μm, and further preferably not smaller than 350 μm and not greater than 500 μm.

Silicon carbide epitaxial layer 5 has a drift region 12, a body region 13, a source region 14, and a contact region 18. Drift region 12 is an n-type (a first conductivity type) region containing such an impurity as nitrogen. An impurity concentration in drift region 12 is, for example, around $5.0 \times 10^{15}$ cm$^{-3}$. Body region 13 is a region having a p-type (a second conductivity type). An impurity contained in body region 13 is, for example, aluminum (Al) or boron (B). A concentration of an impurity contained in body region 13 is, for example, around $1 \times 10^{17}$ cm$^{-3}$.

Source region 14 is an n-type region containing such an impurity as phosphorus. Source region 14 is formed in body region 13 as being surrounded by body region 13. Source region 14 is higher in impurity concentration than drift region 12. An impurity concentration in source region 14 is, for example, $1 \times 10^{20}$ cm$^{-3}$. Source region 14 is spaced apart from drift region 12 by body region 13.

Contact region 18 is a p-type region. Contact region 18 is provided as being surrounded by source region 14 and formed as being in contact with body region 13. Contact region 18 contains such an impurity as Al or B at a concentration higher than a concentration of an impurity contained in body region 13. A concentration of an impurity such as Al or B in contact region 18 is, for example, $1 \times 10^{20}$ cm$^{-3}$.

Gate insulating film 15 is formed as being in contact with first main surface 10a of silicon carbide substrate 10 so as to extend from an upper surface of one source region 14 to an upper surface of the other source region 14. Gate insulating film 15 is in contact with source region 14, body region 13, and drift region 12 at first main surface 10a of silicon carbide substrate 10. Gate insulating film 15 is composed, for example, of silicon dioxide.

Gate electrode 27 is arranged as being in contact with gate insulating film 15 so as to extend from above one source region 14 to above the other source region 14. Gate electrode 27 is formed on source region 14, body region 13, and drift region 12, with gate insulating film 15 being interposed. Gate electrode 27 is formed of a conductor such as polysilicon doped with an impurity or Al.

Source electrode 16 extends from above each of a pair of source regions 14 to above contact region 18 in a direction away from gate insulating film 15 and is arranged as being in contact with first main surface 10a of silicon carbide substrate 10. Source electrode 16 is in contact with source region 14 and contact region 18 at first main surface 10a of silicon carbide substrate 10. Source electrode 16 contains, for example, TiAlSi and is in ohmic contact with source region 14 and contact region 18 in silicon carbide substrate 10.

Interlayer insulating film 21 is provided to cover gate electrode 27 and to be in contact with gate electrode 27 and gate insulating film 15. Interlayer insulating film 21 electrically isolates gate electrode 27 and source electrode 16 from each other. Surface protecting electrode 19 is formed as being in contact with source electrode 16 and contains a conductor such as Al. Surface protecting electrode 19 is electrically connected to source region 14 through source electrode 16.

Drain electrode 20 is provided on second main surface 10b of silicon carbide substrate 10 as being in contact therewith. Drain electrode 20 may be composed of another material such as nickel silicide (NiSi) which can establish ohmic contact with silicon carbide single-crystal substrate 11. Drain electrode 20 is thus electrically connected to silicon carbide single-crystal substrate 11. Backside protecting electrode 23 is formed as being in contact with a main surface of drain electrode 20 opposite to silicon carbide single-crystal substrate 11. Backside protecting electrode 23 has a stack structure constituted, for example, of a Ti layer, a Pt layer, and an Au layer.

A method for manufacturing MOSFET 1 representing the silicon carbide semiconductor device according to the present embodiment will now be described.

Figure 2:
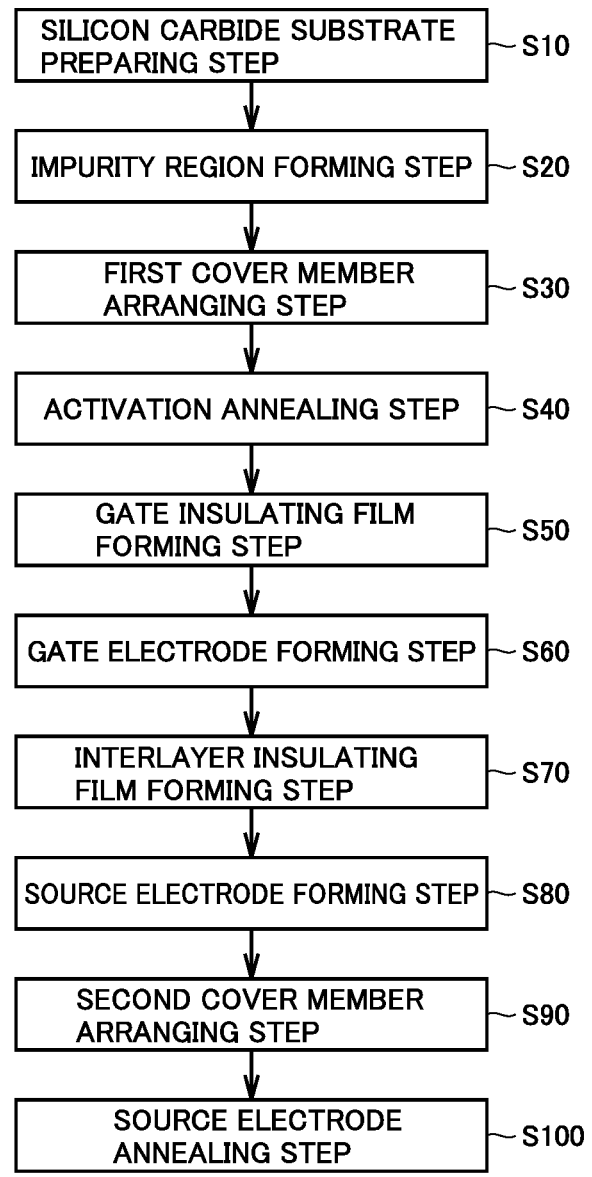
FIG. 2 is a flowchart for schematically illustrating a method for manufacturing a silicon carbide semiconductor device according to one embodiment of the present invention.
Figure 3:
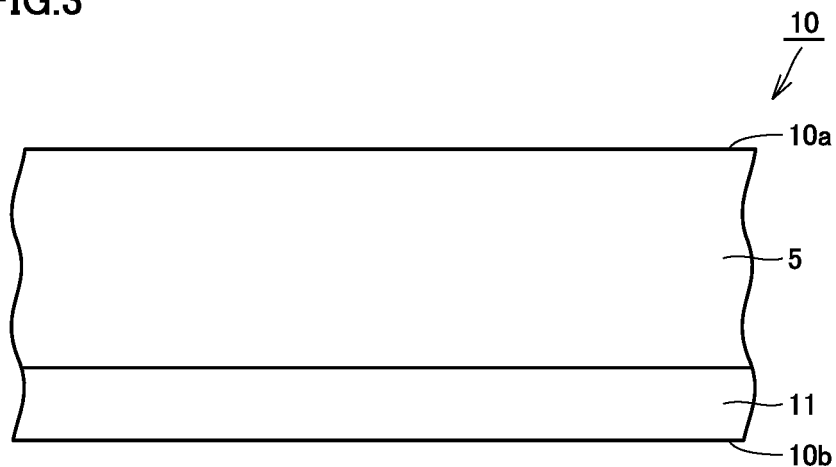
FIG. 3 is a schematic cross-sectional view for schematically illustrating a first step in the method for manufacturing a silicon carbide semiconductor device according to one embodiment of the present invention.

Initially, a silicon carbide substrate preparing step (S10: FIG. 2) is performed. For example, silicon carbide single-crystal substrate 11 is prepared by slicing an ingot composed of single crystals of hexagonal silicon carbide formed with a sublimation method and having polytype 4H. Then, silicon carbide epitaxial layer 5 is formed on silicon carbide single-crystal substrate 11, for example, with chemical vapor deposition (CVD). Specifically, a carrier gas containing hydrogen (H$_2$) and a source gas containing monosilane (SiH$_4$), propane (C$_3$H$_8$), and nitrogen (N$_2$) are supplied over silicon carbide single-crystal substrate 11, and silicon carbide single-crystal substrate 11 is heated to a temperature, for example, approximately not lower than 1500° C. and not higher than 1700° C. Thus, as shown in FIG. 3, silicon carbide epitaxial layer 5 is formed on silicon carbide single-crystal substrate 11. As above, silicon carbide substrate 10 having first main surface 10a and second main surface 10b opposite to first main surface 10a is prepared. Silicon carbide substrate 10 includes silicon carbide single-crystal substrate 11 forming second main surface 10b and silicon carbide epitaxial layer 5 provided on silicon carbide single-crystal substrate 11 and forming first main surface 10a.

Figure 4:
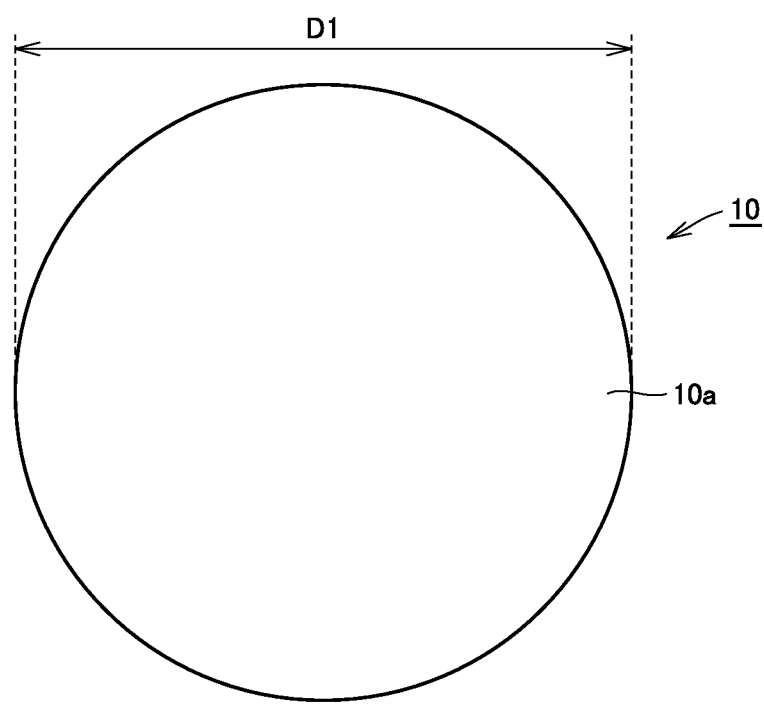
FIG. 4 is a schematic plan view for schematically illustrating the first step in the method for manufacturing a silicon carbide semiconductor device according to one embodiment of the present invention.

Referring to FIG. 4, first main surface 10a of silicon carbide substrate 10 has a substantially annular shape, and first main surface 10a has a maximal diameter D1 greater than 100 mm, preferably not smaller than 150 mm, and more preferably not smaller than 200 mm. Silicon carbide substrate 10 has a thickness T (see FIG. 5), for example, not greater than 700 μm and preferably not greater than 600 μm. Silicon carbide substrate 10 has a thickness preferably not smaller than 250 μm and smaller than 600 μm, more preferably not smaller than 300 μm and smaller than 600 μm, further preferably not smaller than 250 μm and not greater than 500 μm, and further preferably not smaller than 350 μm and not greater than 500 μm.

An amount of warpage of silicon carbide substrate 10 and an amount of warpage of cover member 2 will be described with reference to FIGS. 5 and 6.

Figure 5:
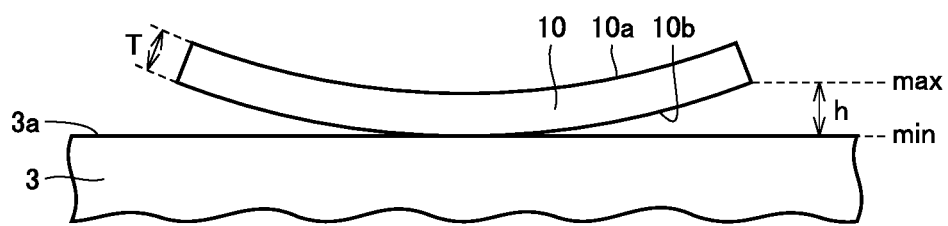
FIG. 5 is a schematic cross-sectional view for illustrating an amount of warpage of a silicon carbide substrate.

Referring to FIG. 5, when silicon carbide substrate 10 is arranged, for example, on flat surface 3a of substrate holding portion 3, due to warpage of silicon carbide substrate 10, a central portion of second main surface 10b of silicon carbide substrate 10 is in contact with surface 3a of substrate holding portion 3, whereas an outer circumferential portion of second main surface 10b of silicon carbide substrate 10 is distant from surface 3a of substrate holding portion 3. An amount of warpage h of silicon carbide substrate 10 represents a distance from a position max in second main surface 10b where second main surface 10b of silicon carbide substrate 10 is most distant from surface 3a of substrate holding portion 3 to surface 3a of substrate holding portion 3 (in other words, a position min where second main surface 10b of silicon carbide substrate 10 is closest to surface 3a of substrate holding portion 3) in a cross-sectional view (a field of view in a direction in parallel to surface 3a of substrate holding portion 3). As shown in FIG. 5, a case that silicon carbide substrate 10 warps as protruding toward surface 3a of substrate holding portion 3 is herein defined as negative warpage.

Figure 6:
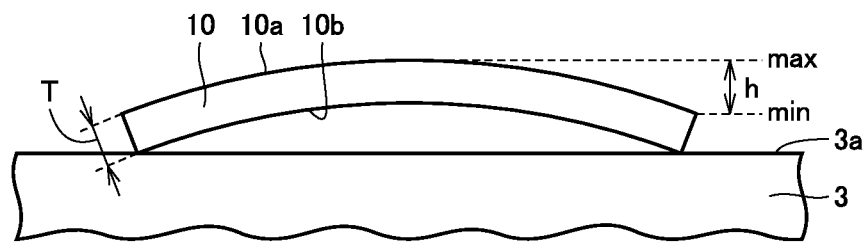
FIG. 6 is a schematic cross-sectional view for illustrating an amount of warpage of a silicon carbide substrate.

Referring to FIG. 6, a case that silicon carbide substrate 10 warps as protruding in a direction opposite to surface 3a of substrate holding portion 3 is defined as positive warpage. In this case, when silicon carbide substrate 10 is arranged, for example, on flat surface 3a of substrate holding portion 3, due to warpage of silicon carbide substrate 10, the outer circumferential portion of second main surface 10b of silicon carbide substrate 10 is in contact with surface 3a of substrate holding portion 3, whereas the central portion of second main surface 10b of silicon carbide substrate 10 is distant from surface 3a of substrate holding portion 3. A first amount of warpage h of silicon carbide substrate 10 represents a distance from position max in first main surface 10a where first main surface 10a of silicon carbide substrate 10 is most distant from surface 3a of substrate holding portion 3 to position min in first main surface 10a where first main surface 10a of silicon carbide substrate 10 is closest to surface 3a of substrate holding portion 3 in a cross-sectional view. Definition of an amount of warpage of cover member 2 which will be described later is the same as the definition of the amount of warpage of silicon carbide substrate 10.

The amount of warpage of each of cover member 2 and silicon carbide substrate 10 is measured while silicon carbide substrate 10 or cover member 2 is arranged on flat surface 3a at a room temperature (27° C.) and cover member 2 and silicon carbide substrate 10 are not clamped, for example, by an electrostatic chuck.

Figure 7:
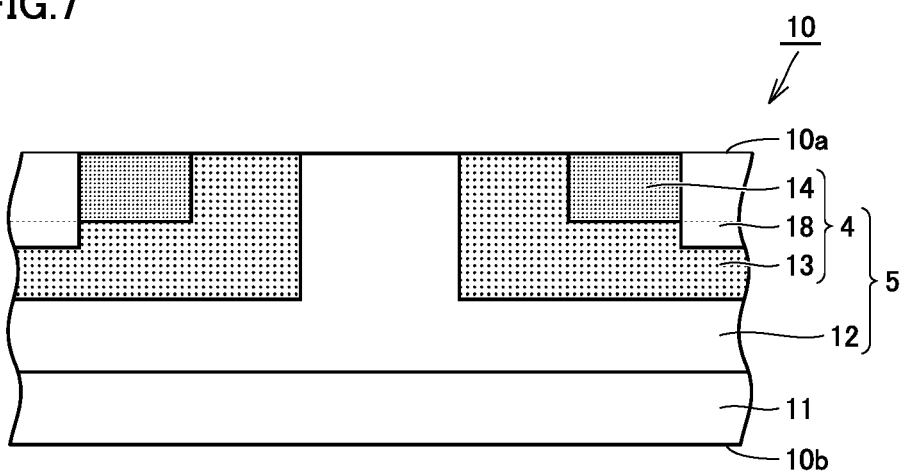
FIG. 7 is a schematic cross-sectional view for schematically illustrating a second step in the method for manufacturing a silicon carbide semiconductor device according to one embodiment of the present invention.

Then, an impurity region forming step (S20: FIG. 2) is performed. Specifically, referring to FIG. 7, ions are implanted into first main surface 10a of silicon carbide substrate 10. For example, aluminum (Al) ions are implanted into first main surface 10a of silicon carbide substrate 10, so that body region 13 having the p conductivity type is formed in silicon carbide epitaxial layer 5. Then, for example, ions of phosphorus (P) are implanted into body region 13 to a depth smaller than an implantation depth of Al ions, so that source region 14 having the n conductivity type is formed. For example, Al ions are further implanted into source region 14, so that contact region 18 surrounded by source region 14, having a depth as large as source region 14, and having the p conductivity type is formed. A region in silicon carbide epitaxial layer 5 where none of body region 13, source region 14, and contact region 18 is formed is defined as drift region 12. As above, impurity region 4 formed through ion implantation, which includes body region 13, source region 14, and contact region 18, is formed on a side of first main surface 10a of silicon carbide substrate 10. First main surface 10a of silicon carbide substrate 10 may include impurity region 4 and outer circumferential portion 10c where impurity region is not formed.

Figure 8:
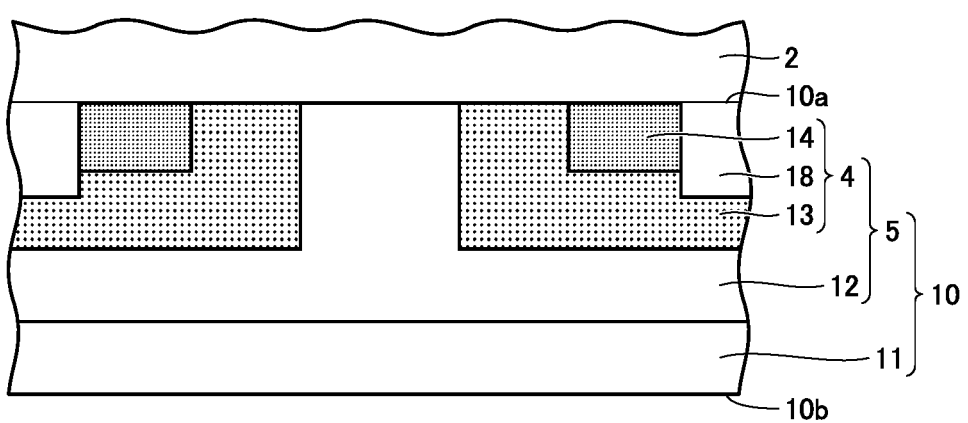
FIG. 8 is an enlarged schematic cross-sectional view for schematically illustrating a third step in the method for manufacturing a silicon carbide semiconductor device according to one embodiment of the present invention.

Then, a first cover member arranging step (S30: FIG. 2) is performed. Specifically, referring to FIGS. 8 and 9, in a plan view (a field of view along a direction of normal to first main surface 10a), first cover member 2 is arranged on the side of first main surface 10a of silicon carbide substrate 10 so as to cover at least the entire impurity region 4 including body region 13, source region 14, and contact region 18. Preferably, as shown in FIG. 8, first cover member 2 is arranged as being in contact with first main surface 10a of silicon carbide substrate 10. First cover member 2 should only be in contact with at least a part of first main surface 10a of silicon carbide substrate 10 and does not have to be in contact with the entire first main surface 10a. For example, first cover member 2 may be provided as being in contact with impurity region 4 exposed at first main surface 10a and as being distant from an outer circumferential portion 10d of first main surface 10a.

Figure 14:
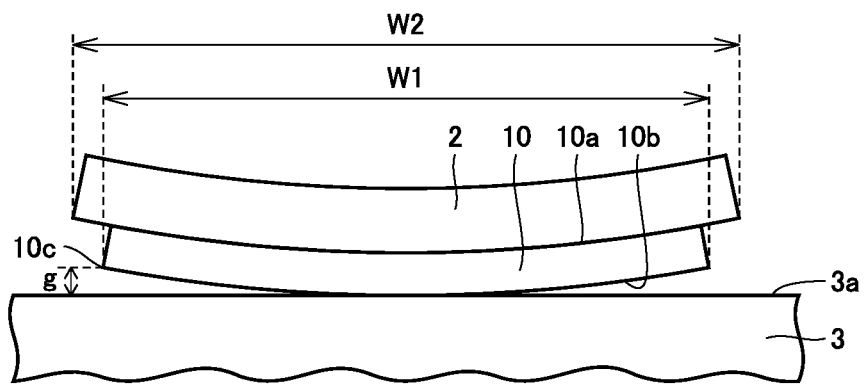
FIG. 14 is a schematic cross-sectional view for schematically illustrating a modification of the third step in the method for manufacturing a silicon carbide semiconductor device according to one embodiment of the present invention.

As shown in FIG. 14, in a cross-sectional view, a width W2 of first cover member 2 along first main surface 10a of silicon carbide substrate 10 may be greater than a width W1 of first main surface 10a in the direction along first main surface 10a. Preferably, first cover member 2 is made of a material containing at least any of carbon and silicon carbide. In other words, first cover member 2 may be a carbon layer or a silicon carbide layer, a member obtained by coating a surface of a silicon carbide layer with a carbon layer, or a member obtained by coating a surface of a carbon layer with a carbon layer denser than the former carbon layer. First cover member 2 may be arranged such that a coated layer faces first main surface 10a of silicon carbide substrate 10. Preferably, first cover member 2 is composed of polycrystalline silicon carbide. Polycrystalline silicon carbide is smaller in amount of warpage and lower in cost than single-crystal silicon carbide.

In the first cover member arranging step (S30: FIG. 2), first cover member 2 satisfying a condition that an absolute value of a difference between a first amount of warpage and a second amount of warpage is not greater than 100 μm is arranged as being in contact with first main surface 10a of silicon carbide substrate 10, with an amount of warpage of silicon carbide substrate 10 at a room temperature being defined as the first amount of warpage and an amount of warpage of first cover member 2 at a room temperature being defined as the second amount of warpage. First amount of warpage h of silicon carbide substrate 10 is, for example, 50 μm when first main surface 10a is a silicon face, and it is, for example, −50 μm when first main surface 10a is a carbon face. When first main surface 10a is the silicon face, silicon carbide substrate 10 warps as first main surface 10a protrudes as shown in FIG. 6. An amount of warpage of first cover member 2 is, for example, approximately not smaller than −50 μm and not greater than 50 μm.

Figure 9:
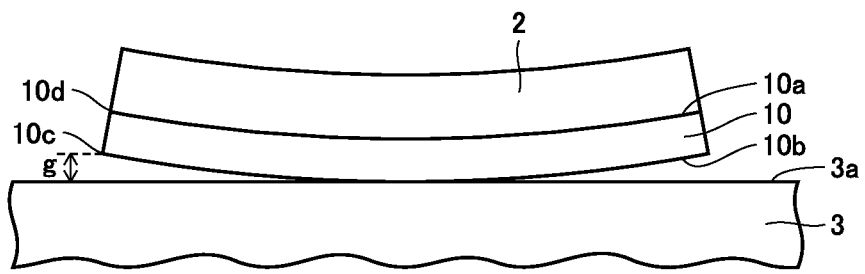
FIG. 9 is a schematic cross-sectional view for schematically illustrating the third step in the method for manufacturing a silicon carbide semiconductor device according to one embodiment of the present invention.

Referring to FIG. 9, as first cover member 2 is arranged on first main surface 10a of silicon carbide substrate 10, an amount of warpage of silicon carbide substrate 10 is reduced by the weight of first cover member 2. Namely, an amount of warpage g of silicon carbide substrate 10 after first cover member 2 is arranged is smaller than first amount of warpage h of silicon carbide substrate 10 before first cover member 2 is arranged. When an absolute value of a difference between the first amount of warpage of silicon carbide substrate 10 and the second amount of warpage of first cover member 2 is small, an area of contact between first main surface 10a of silicon carbide substrate 10 and first cover member 2 increases. Namely, since a gap between first main surface 10a of silicon carbide substrate 10 and first cover member 2 is smaller, for example, adhesion of such an impurity as sodium onto first main surface 10a of silicon carbide substrate 10 can effectively be suppressed. Preferably, first cover member 2 is arranged on the side of first main surface 10a of silicon carbide substrate 10 such that a direction of warpage of first cover member 2 (positive and negative of warpage) is the same as a direction of warpage of silicon carbide substrate 10 (positive and negative of warpage). First cover member 2 is preferably greater in thickness than silicon carbide substrate 10. First cover member 2 has a thickness, for example, approximately not smaller than 300 μm and not greater than 1 mm. First cover member 2 is merely arranged on first main surface 10a of silicon carbide substrate 10 and not fixed to silicon carbide substrate 10.

Then, an activation annealing step (S40: FIG. 2) is performed. Specifically, silicon carbide substrate 10 is annealed at a temperature lower than a melting point of cover member 2 while cover member 2 is arranged on the side of first main surface 10a of silicon carbide substrate 10. More specifically, second main surface 10b of silicon carbide substrate 10 is arranged on surface 3a of substrate holding portion 3 and held on substrate holding portion 3 while impurity region 4 is in contact with first cover member 2 at first main surface 10a of silicon carbide substrate 10. Silicon carbide substrate 10 and first cover member 2 are heated to a temperature, for example, not lower than 1600° C. and not higher than 2000° C. for approximately 30 minutes. Thus, impurities in impurity region 4 formed in the ion implantation step are activated and desired carriers are thus generated.

With arrangement of cover member 2 on the side of first main surface 10a of silicon carbide substrate 10 in the activation annealing step (S40: FIG. 2), adhesion of such a metal impurity as sodium (Na) and iron (Fe) present in an annealing furnace to first main surface 10a of silicon carbide substrate 10 can be suppressed. A metal impurity may be chromium (Cr), copper (Cu), zinc (Zn), calcium (Ca), potassium (K), manganese (Mn), magnesium (Mg), cobalt (Co), nickel (Ni), and aluminum (Al). A density of each of the metal impurities on first main surface 10a of silicon carbide substrate 10 after the activation annealing step (S40: FIG. 2) is desirably less than $1\times10^{12}$ atoms/cm$^2$. A density of a metal impurity can be measured with inductively coupled plasma mass spectrometry (ICP-MS) or fluorescent X-rays.

Figure 10:
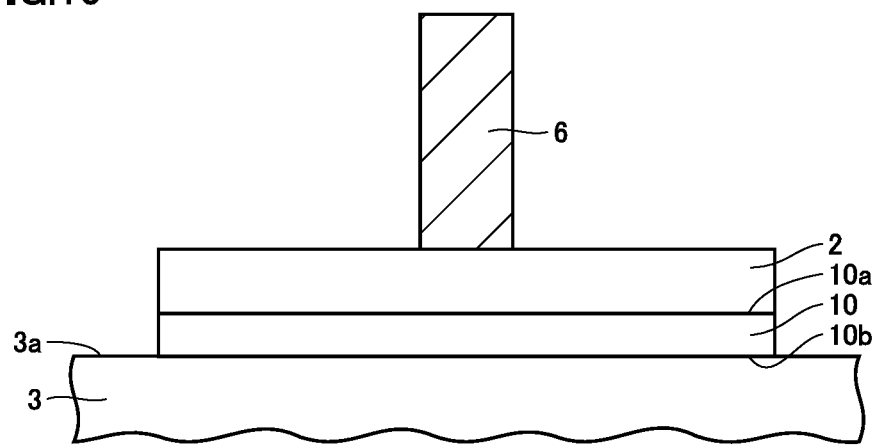
FIG. 10 is a schematic cross-sectional view for schematically illustrating a fourth step in the method for manufacturing a silicon carbide semiconductor device according to one embodiment of the present invention.
Figure 15:
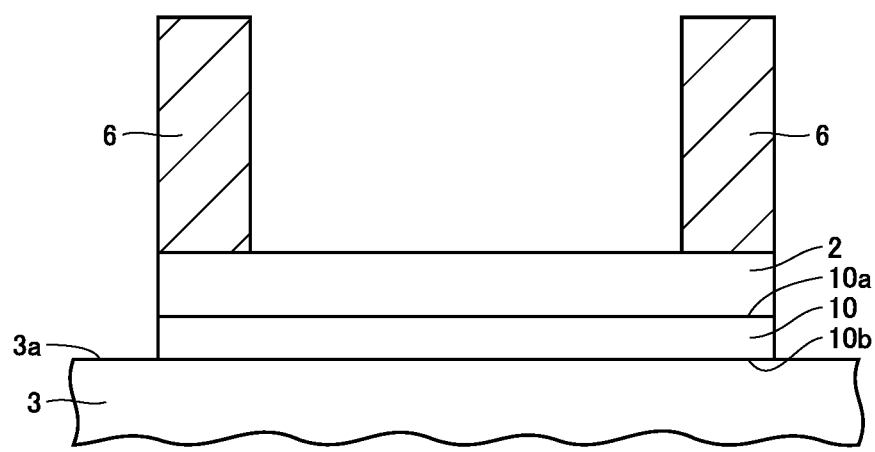
FIG. 15 is a schematic cross-sectional view for schematically illustrating a modification of the fourth step in the method for manufacturing a silicon carbide semiconductor device according to one embodiment of the present invention.

Referring to FIG. 10, after first cover member 2 is arranged, first cover member 2 may be pressed against silicon carbide substrate 10. Specifically, for example, a pressing portion 6 made of carbon is arranged on a surface of first cover member 2 opposite to the surface in contact with silicon carbide substrate 10 and pressing portion 6 is moved downward from above in FIG. 10 (in other words, in a direction from first main surface 10a to second main surface 10b of silicon carbide substrate 10) to press first cover member 2 against silicon carbide substrate 10. As shown in FIG. 10, pressing portion 6 may be arranged on a center side of first cover member 2 in a cross-sectional view. Alternatively, as shown in FIG. 15, pressing portion 6 may be arranged on an outer circumferential side of first cover member 2 in a cross-sectional view.

When pressing portion 6 is arranged on the center side of first cover member 2 in a cross-sectional view, the center side of first cover member 2 is pressed against a center side of first main surface 10a of silicon carbide substrate 10, so that an amount of warpage of silicon carbide substrate 10 is reduced. When pressing portion 6 is arranged on the outer circumferential side of first cover member 2, the outer circumferential side of first cover member 2 is pressed against an outer circumferential side of first main surface 10a of silicon carbide substrate 10 so that an amount of warpage of silicon carbide substrate 10 is reduced.

After the impurity region forming step (S20: FIG. 2), silicon carbide substrate 10 may be held on substrate holding portion 3 such that second main surface 10b of silicon carbide substrate 10 faces surface 3a of substrate holding portion 3. Preferably, when first cover member 2 is pressed against silicon carbide substrate 10, first cover member 2 is pressed against silicon carbide substrate 10 such that gap g between outer circumferential portion 10c of second main surface 10b of silicon carbide substrate 10 and surface 3a of substrate holding portion 3 is made smaller (see FIGS. 9 and 15). Preferably, first cover member 2 is pressed against silicon carbide substrate 10 such that outer circumferential portion 10c of second main surface 10b of silicon carbide substrate 10 is in contact with surface 3a of substrate holding portion 3.

The step of pressing first cover member 2 against silicon carbide substrate 10 may be performed during or before the activation annealing step (S40: FIG. 2). In other words, first cover member 2 and silicon carbide substrate 10 may be heated after first cover member 2 is pressed against silicon carbide substrate 10, or first cover member 2 may be pressed against silicon carbide substrate 10 after silicon carbide substrate 10 is heated and an amount of warpage of silicon carbide substrate 10 increases, so that an amount of warpage of silicon carbide substrate 10 may be reduced. After the activation annealing step ends, first cover member 2 is removed from first main surface 10a of silicon carbide substrate 10.

Figure 11:
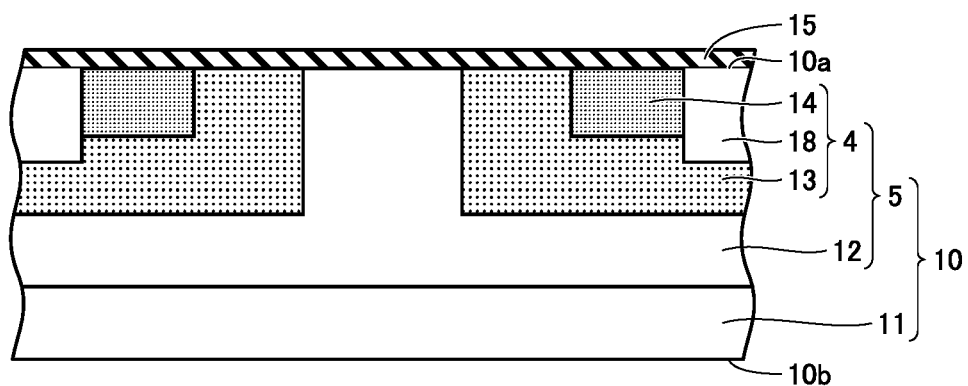
FIG. 11 is a schematic cross-sectional view for schematically illustrating a fifth step in the method for manufacturing a silicon carbide semiconductor device according to one embodiment of the present invention.

Then, a gate insulating film forming step (S50: FIG. 2) is performed. Referring to FIG. 11, for example, gate insulating film 15 composed of silicon dioxide is formed to cover first main surface 10a of silicon carbide substrate 10, by heating silicon carbide substrate 10 for approximately 1 hour in an atmosphere containing, for example, oxygen, for example, at 1350° C. Specifically, gate insulating film 15 is formed as being in contact with drift region 12, body region 13, source region 14, and contact region 18 at first main surface 10a, so as to extend from one contact region 18 to the other contact region 18.

Then, a gate electrode forming step (S60: FIG. 2) is performed. Gate electrode 27 being in contact with gate insulating film 15 and composed of polysilicon containing an impurity is formed, for example, with low pressure chemical vapor deposition (LPCVD). Gate electrode 27 is formed to face source region 14 and body region 13 representing impurity region 4, with gate insulating film 15 being interposed.

Then, an interlayer insulating film forming step (S70: FIG. 2) is performed. Interlayer insulating film 21 composed of silicon dioxide is formed to cover gate electrode 27 and to be in contact with gate insulating film 15 and gate electrode 27, for example, with plasma (P)-CVD. In other words, interlayer insulating film 21 is formed such that gate electrode 27 is surrounded by gate insulating film 15 and interlayer insulating film 21.

Figure 12:
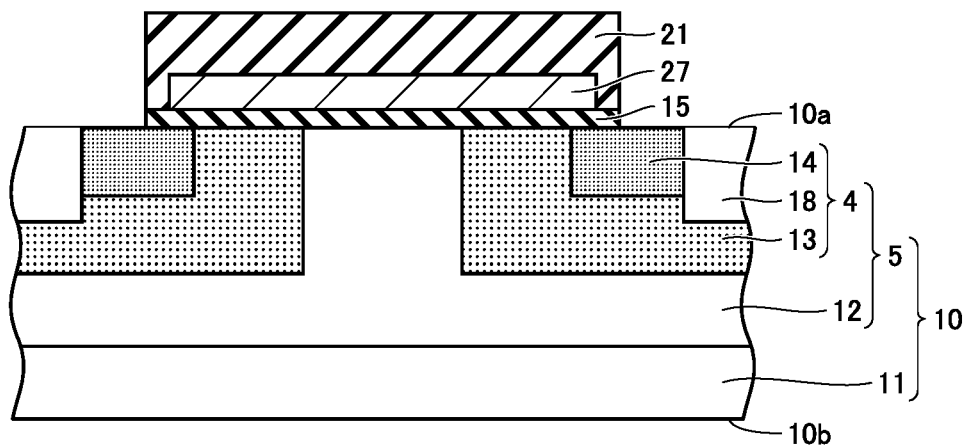
FIG. 12 is a schematic cross-sectional view for schematically illustrating a sixth step in the method for manufacturing a silicon carbide semiconductor device according to one embodiment of the present invention.

Then, a source electrode forming step (S80: FIG. 2) is performed. Referring to FIG. 12, interlayer insulating film 21 and gate insulating film 15 are removed in a region where source electrode 16 is to be formed, and a region where source region 14 and contact region 18 are exposed through interlayer insulating film 21 and gate insulating film 15 is formed. Then, source electrode 16 containing, for example, NiSi or TiAlSi (titanium aluminum silicon) is formed in that region, for example, through sputtering. Source electrode 16 is formed as being in contact with source region 14 and contact region 18 at first main surface 10a of silicon carbide substrate 10.

Figure 13:
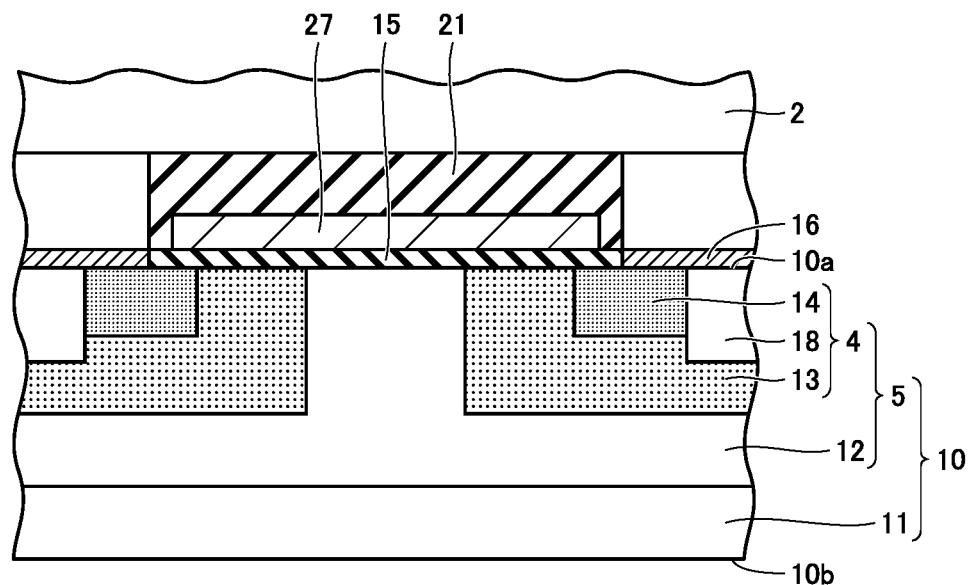
FIG. 13 is a schematic cross-sectional view for schematically illustrating a seventh step in the method for manufacturing a silicon carbide semiconductor device according to one embodiment of the present invention.

Then, a second cover member arranging step (S90: FIG. 2) is performed. Specifically, second cover member 2 is arranged on the side of first main surface 10a of silicon carbide substrate 10 so as to cover at least the entire impurity region 4 including body region 13, source region 14, and contact region 18 in a plan view. Preferably, as shown in FIG. 13, second cover member 2 is arranged on the side of first main surface 10a of silicon carbide substrate 10 so as to be in contact with interlayer insulating film 21 and distant from source electrode 16.

As shown in FIG. 14, in a cross-sectional view, width W2 of second cover member 2 along first main surface 10a of silicon carbide substrate 10 may be greater than width W1 of first main surface 10a in the direction along first main surface 10a. Preferably, second cover member 2 is made of a material containing at least any of carbon, silicon, quartz, and silicon carbide. In other words, second cover member 2 may be a carbon layer or a silicon carbide layer, a member obtained by coating a surface of a silicon carbide layer with a carbon layer, or a member obtained by coating a surface of a carbon layer with a carbon layer denser than the former carbon layer. First cover member 2 may be arranged such that a coated layer faces first main surface 10a of silicon carbide substrate 10. Preferably, first cover member 2 is composed of polycrystalline silicon carbide. Polycrystalline silicon carbide is smaller in amount of warpage and lower in cost than single-crystal silicon carbide.

In the second cover member arranging step (S90: FIG. 2), second cover member 2 satisfying a condition that an absolute value of a difference between a first amount of warpage and a second amount of warpage is not greater than 100 μm is arranged on the side of first main surface 10a of silicon carbide substrate 10, with an amount of warpage of silicon carbide substrate 10 at a room temperature being defined as the first amount of warpage and an amount of warpage of second cover member 2 at a room temperature being defined as the second amount of warpage. An amount of warpage of second cover member 2 is, for example, approximately not smaller than −50 μm and not greater than 50 μm.

Referring to FIG. 9, as second cover member 2 is arranged on the side of first main surface 10a of silicon carbide substrate 10, an amount of warpage of silicon carbide substrate 10 is reduced by the weight of second cover member 2. When an absolute value of a difference between the first amount of warpage of silicon carbide substrate 10 and the second amount of warpage of second cover member 2 is small, an area of contact between interlayer insulating film 21 provided on the side of first main surface 10a of silicon carbide substrate 10 and second cover member 2 increases. Namely, since a gap between interlayer insulating film 21 provided on the side of first main surface 10a of silicon carbide substrate 10 and second cover member 2 is made smaller, for example, diffusion of such an impurity as sodium into an interface between first main surface 10a of silicon carbide substrate 10 and gate insulating film 15 can effectively be suppressed. Preferably, second cover member 2 is arranged on the side of first main surface 10a of silicon carbide substrate 10 such that a direction of warpage of second cover member 2 (positive and negative of warpage) is the same as a direction of warpage of silicon carbide substrate 10 (positive and negative of warpage). Second cover member 2 is preferably greater in thickness than silicon carbide substrate 10. Second cover member 2 has a thickness, for example, approximately not smaller than 300 μm and not greater than 1 mm. Second cover member 2 is merely arranged on interlayer insulating film 21 provided on the side of first main surface 10a of silicon carbide substrate 10 and not fixed to interlayer insulating film 21.

Then, a source electrode annealing step (S100: FIG. 2) is performed. Specifically, second main surface 10b of silicon carbide substrate 10 is arranged as being in contact with surface 3a of substrate holding portion 3 such as a tray and held on substrate holding portion 3 while second cover member 2 is arranged on the side of first main surface 10a of silicon carbide substrate 10 so as to be in contact with interlayer insulating film 21 and distant from source electrode 16. Silicon carbide substrate 10 provided with source electrode 16 and second cover member 2 are preferably annealed for approximately 5 minutes at a temperature not lower than 900° C. and not higher than 1300° C. Thus, at least a part of source electrode 16 is silicided and source electrode 16 in ohmic contact with source region 14 and contact region 18 is formed.

When cover member 2 is arranged on the side of first main surface 10a of silicon carbide substrate 10 in the source electrode annealing step (S100: FIG. 2), adhesion of a metal impurity such as sodium (Na) and iron (Fe) present in an annealing furnace to first main surface 10a of silicon carbide substrate 10 can be suppressed. A metal impurity may be chromium (Cr), copper (Cu), zinc (Zn), calcium (Ca), potassium (K), manganese (Mn), magnesium (Mg), cobalt (Co), nickel (Ni), and aluminum (Al). A density of each of the metal impurities at the interface between first main surface 10a of silicon carbide substrate 10 and gate insulating film 15 after the source electrode annealing step (S100: FIG. 2) is desirably less than $1 \times 10^{12}$ atoms/cm². A density of a metal impurity can be measured with ICP-MS or fluorescent X-rays.

Second cover member 2 may be pressed against interlayer insulating film 21 provided on the side of first main surface 10a of silicon carbide substrate 10. Specifically, for example, pressing portion 6 made of carbon is arranged on a surface of second cover member 2 opposite to the surface in contact with interlayer insulating film 21 of silicon carbide substrate 10 and pressing portion 6 is moved in a direction from first main surface 10a to second main surface 10b of silicon carbide substrate 10 to press second cover member 2 against interlayer insulating film 21 provided on silicon carbide substrate 10. Pressing portion 6 may be arranged on a center side of second cover member 2 in a cross-sectional view, or pressing portion 6 may be arranged on an outer circumferential side of second cover member 2 in a cross-sectional view.

Silicon carbide substrate 10 may be held on substrate holding portion 3 such that second main surface 10b of silicon carbide substrate 10 faces surface 3a of substrate holding portion 3. Preferably, when second cover member 2 is pressed against interlayer insulating film 21 provided on the side of first main surface 10a of silicon carbide substrate 10, second cover member 2 is pressed against silicon carbide substrate 10 such that gap g between outer circumferential portion 10c of second main surface 10b of silicon carbide substrate 10 and surface 3a of substrate holding portion 3 is made smaller (see FIGS. 9 and 15). Preferably, second cover member 2 is pressed against silicon carbide substrate 10 such that outer circumferential portion 10c of second main surface 10b of silicon carbide substrate 10 is in contact with surface 3a of substrate holding portion 3.

The step of pressing second cover member 2 against silicon carbide substrate 10 may be performed during or before the source electrode annealing step (S100: FIG. 2). In other words, second cover member 2 and silicon carbide substrate 10 may be heated after second cover member 2 is pressed against interlayer insulating film 21 provided on silicon carbide substrate 10, or second cover member 2 may be pressed against interlayer insulating film 21 provided on silicon carbide substrate 10 after silicon carbide substrate 10 is heated and an amount of warpage of silicon carbide substrate 10 increases, so that an amount of warpage of silicon carbide substrate 10 may be reduced. After the source electrode annealing step ends, second cover member 2 is removed from the side of first main surface 10a of silicon carbide substrate 10.

Then, surface protecting electrode 19 is formed to be in contact with source electrode 16 and to cover interlayer insulating film 21. Source electrode 16 is composed of a material containing, for example, aluminum. Then, drain electrode 20 composed, for example, of NiSi is formed as being in contact with second main surface 10b of silicon carbide substrate 10. Drain electrode 20 may be composed, for example, of TiAlSi. Though drain electrode 20 is preferably formed through sputtering, it may be formed through vapor deposition. After drain electrode 20 is formed, drain electrode 20 is heated, for example, through laser annealing. At least a part of drain electrode 20 is thus silicided and drain electrode 20 in ohmic contact with silicon carbide single-crystal substrate 11 is formed. Backside protecting electrode 23 is formed as being in contact with drain electrode 20.

Though a method for manufacturing a MOSFET including both of the first cover member and the second cover member has been described in the embodiment above, a MOSFET may be manufactured with only any one of the first cover member and the second cover member being used. In the embodiment above, a MOSFET in which the n-type and the p-type are interchanged may be employed.

Though a planar MOSFET has been described in the embodiment by way of example of the silicon carbide semiconductor device according to the present invention, the silicon carbide semiconductor device may be, for example, a trench MOSFET, an insulated gate bipolar transistor (IGBT), or a Schottky barrier diode.

A function and effect of the method for manufacturing a MOSFET representing the silicon carbide semiconductor device according to the present embodiment will now be described.

According to the method for manufacturing MOSFET 1 according to the present embodiment, cover member 2 is arranged on the side of first main surface 10*a* of silicon carbide substrate 10 so as to cover at least the entire impurity region 4 in a plan view, and silicon carbide substrate 10 is annealed at a temperature lower than a melting point of cover member 2 while cover member 2 is arranged on the side of first main surface 10*a* of silicon carbide substrate 10. Since cover member 2 is arranged on the side of first main surface 10*a* of silicon carbide substrate 10, warpage of silicon carbide substrate 10 can be lessened by a weight of cover member 2. Since silicon carbide substrate 10 is annealed while cover member 2 is arranged on the side of first main surface 10*a* of silicon carbide substrate 10 so as to cover the entire impurity region 4, adhesion of such a metal impurity as sodium in the vicinity of impurity region 4 can be suppressed.

According to the method for manufacturing MOSFET 1 according to the present embodiment, in the step of arranging cover member 2, cover member 2 satisfying a condition that an absolute value of a difference between a first amount of warpage and a second amount of warpage is not greater than 100 μm is arranged, with an amount of warpage of silicon carbide substrate 10 at a room temperature being defined as the first amount of warpage and an amount of warpage of cover member 2 at a room temperature being defined as the second amount of warpage. Thus, a gap between first main surface 10*a* of silicon carbide substrate 10 and cover member 2 can effectively be made smaller. Consequently, adhesion of such a metal impurity as sodium in the vicinity of impurity region 4 can effectively be suppressed.

According to the method for manufacturing MOSFET 1 according to the present embodiment, in the step of arranging cover member 2, the first main surface has a maximal diameter not smaller than 150 mm. Thus, warpage of silicon carbide substrate 10 can effectively be lessened even in such a situation that a diameter of silicon carbide substrate 10 is greater and silicon carbide substrate 10 tends to warp.

According to the method for manufacturing MOSFET 1 according to the present embodiment, silicon carbide substrate 10 has a thickness not greater than 700 μm. Thus, warpage of silicon carbide substrate 10 can effectively be lessened even in such a situation that a thickness of silicon carbide substrate 10 is smaller and silicon carbide substrate 10 tends to warp.

According to the method for manufacturing MOSFET 1 according to the present embodiment, a width of cover member 2 along first main surface 10*a* of silicon carbide substrate 10 is greater than a width of first main surface 10*a*. Thus, warpage of silicon carbide substrate 10 can effectively be lessened and adhesion of a metal impurity to first main surface 10*a* of silicon carbide substrate 10 can effectively be suppressed.

According to the method for manufacturing MOSFET 1 according to the present embodiment, the step of arranging cover member 2 includes the step of arranging cover member 2 as being in contact with first main surface 10*a* of silicon carbide substrate 10. The step of annealing silicon carbide substrate 10 includes the step of activating an impurity in impurity region 4. Since cover member 2 is thus arranged as being in contact with first main surface 10*a* of silicon carbide substrate 10, adhesion of such a metal impurity as sodium to first main surface 10*a* of silicon carbide substrate 10 can be suppressed.

According to the method for manufacturing MOSFET 1 according to the present embodiment, made of a material containing at least any of carbon and silicon carbide. Thus, adhesion of such a metal impurity as sodium to first main surface 10*a* of silicon carbide substrate 10 can effectively be suppressed also in a temperature range of annealing for activating an impurity in impurity region 4.

According to the method for manufacturing MOSFET 1 according to the present embodiment, gate electrode 27 provided to face impurity region 4 in silicon carbide substrate 10 is formed after impurity region 4 is formed. Interlayer insulating film 21 covering gate electrode 27 is formed. Source electrode 16 in contact with first main surface 10*a* of silicon carbide substrate 10 is formed. The step of arranging cover member 2 includes the step of arranging cover member 2 so as to be in contact with interlayer insulating film 21 and distant from source electrode 16. Since cover member 2 is thus distant from source electrode 16, reaction between cover member 2 and source electrode 16 resulting in variation in contact resistance between source electrode 16 and silicon carbide substrate 10 can be suppressed.

According to the method for manufacturing MOSFET 1 according to the present embodiment, the cover member is made of a material containing at least any of carbon, silicon, quartz, and silicon carbide. Thus, adhesion of such a metal impurity as sodium to first main surface 10*a* of silicon carbide substrate 10 can effectively be suppressed also in a temperature range of annealing for alloying source electrode 16.

The method for manufacturing MOSFET 1 according to the present embodiment further includes the step of pressing cover member 2 against silicon carbide substrate 10 after the step of arranging cover member 2. Thus, since a gap between cover member 2 and silicon carbide substrate 10 is made smaller, adhesion of such a metal impurity as sodium to first main surface 10*a* of silicon carbide substrate 10 can effectively be suppressed. In addition, since silicon carbide substrate 10 is heated by heat conduction through a mechanism pressing cover member 2 against silicon carbide substrate 10, a temperature in silicon carbide substrate 10 is made uniform. Consequently, warpage of silicon carbide substrate 10 can effectively be lessened.

The method for manufacturing MOSFET 1 according to the present embodiment further includes the step of holding silicon carbide substrate 10 on substrate holding portion 3 such that second main surface 10*b* of silicon carbide substrate 10 faces surface 3*a* of substrate holding portion 3 after the step of forming impurity region 4. In the step of pressing cover member 2 against silicon carbide substrate 10, cover member 2 is pressed against silicon carbide substrate 10 such that a gap between the outer circumferential portion of second main surface 10*b* of silicon carbide substrate 10 and surface 3*a* of substrate holding portion 3 is made smaller. Since a gap between the outer circumferential portion of second main surface 10*b* of silicon carbide substrate 10 and surface 3*a* of substrate holding portion 3 is thus made smaller, heat from substrate holding portion 3 can effectively conduct to silicon carbide substrate 10. Consequently, a temperature in silicon carbide substrate 10 is made uniform and warpage of silicon carbide substrate 10 can effectively be lessened.

It should be understood that the embodiment disclosed herein is illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 silicon carbide semiconductor device (MOSFET); 2 cover member, first cover member, second cover member; 3 substrate holding portion; 3a surface; 4 impurity region; 5 silicon carbide epitaxial layer; 6 pressing portion; 10 silicon carbide substrate; 10a first main surface; 10b second main surface; 10c, 10d outer circumferential portion; 11 silicon carbide single-crystal substrate; 12 drift region; 13 body region; 14 source region; 15 gate insulating film; 16 source electrode; 18 contact region; 19 surface protecting electrode; 20 drain electrode; 21 interlayer insulating film; 23 backside protecting electrode; 27 gate electrode; D1 maximal diameter; W1, W2 width; g amount of warpage (gap); h amount of warpage; and T thickness.

The invention claimed is:

1. A method for manufacturing a silicon carbide semiconductor device, comprising the steps of:
preparing a silicon carbide substrate having a first main surface and a second main surface opposite to the first main surface, the first main surface having a maximal diameter greater than 100 mm;
forming an impurity region on a side of the first main surface of the silicon carbide substrate;
forming a gate electrode provided to face the impurity region in the silicon carbide substrate after the step of forming an impurity region;
forming an interlayer insulating film covering the gate electrode;
forming a source electrode in contact with the first main surface of the silicon carbide substrate;
arranging a cover member on the side of the first main surface so as to cover at least the entire impurity region in a plan view wherein the step of arranging a cover member includes the step of arranging the cover member so as to be in contact with the interlayer insulating film and distant from the source electrode; and
annealing the silicon carbide substrate at a temperature lower than a melting point of the cover member while the cover member is arranged on the side of the first main surface of the silicon carbide substrate.

2. The method for manufacturing a silicon carbide semiconductor device according to claim 1, wherein
in the step of arranging a cover member, the cover member satisfying a condition that an absolute value of a difference between a first amount of warpage and a second amount of warpage is not greater than 100 μm is arranged, with an amount of warpage of the silicon carbide substrate at a room temperature being defined as the first amount of warpage and an amount of warpage of the cover member at a room temperature being defined as the second amount of warpage.

3. The method for manufacturing a silicon carbide semiconductor device according to claim 1, wherein
the first main surface has a maximal diameter not smaller than 150 mm.

4. The method for manufacturing a silicon carbide semiconductor device according to claim 1, wherein
the silicon carbide substrate has a thickness not greater than 700 μm.

5. The method for manufacturing a silicon carbide semiconductor device according to claim 1, wherein
in a cross-sectional view, a width of the cover member along the first main surface of the silicon carbide substrate is greater than a width of the first main surface.

6. The method for manufacturing a silicon carbide semiconductor device according to claim 1, further comprising the steps of:
arranging another cover member on the side of the first main surface so as to cover at least the entire impurity region in a plan view, said another cover member being in contact with the first main surface of the silicon carbide substrate, and
annealing the silicon carbide substrate to activate an impurity in the impurity region at a temperature lower than a melting point of said another cover member while said another cover member is arranged on the side of the first main surface of the silicon carbide substrate.

7. The method for manufacturing a silicon carbide semiconductor device according to claim 6, wherein
said another cover member is made of a material containing at least any of carbon and silicon carbide.

8. The method for manufacturing a silicon carbide semiconductor device according to claim 1, wherein
the cover member is made of a material containing at least any of carbon, silicon, quartz, and silicon carbide.

9. The method for manufacturing a silicon carbide semiconductor device according to claim 1, further comprising the step of pressing the cover member against the silicon carbide substrate after the step of arranging a cover member.

10. The method for manufacturing a silicon carbide semiconductor device according to claim 9, further comprising the step of holding the silicon carbide substrate on the substrate holding portion such that the second main surface of the silicon carbide substrate faces a surface of the substrate holding portion after the step of forming an impurity region, wherein
in the step of pressing the cover member against the silicon carbide substrate, the cover member is pressed against the silicon carbide substrate such that a gap between an outer circumferential portion of the second main surface of the silicon carbide substrate and the surface of the substrate holding portion is made smaller.

* * * * *